United States Patent
Tang

(10) Patent No.: US 10,699,777 B2
(45) Date of Patent: *Jun. 30, 2020

(54) ACCESS DEVICE AND ASSOCIATED STORAGE DEVICE FOR PERFORMING REWRITE OPERATION BASED ON TRIGGER LEVEL

(71) Applicant: Chao-Jing Tang, Keelung (TW)

(72) Inventor: Chao-Jing Tang, Keelung (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/533,755

(22) Filed: Aug. 6, 2019

(65) Prior Publication Data

US 2019/0362778 A1    Nov. 28, 2019

Related U.S. Application Data

(63) Continuation of application No. 15/694,859, filed on Sep. 4, 2017, now Pat. No. 10,482,951.

(30) Foreign Application Priority Data

May 4, 2017   (TW) .............................. 106114794 A
May 17, 2017  (TW) .............................. 106116248 A

(51) Int. Cl.
*G11C 11/419* (2006.01)
*G11C 11/418* (2006.01)
(Continued)

(52) U.S. Cl.
CPC ............ *G11C 11/419* (2013.01); *G11C 5/147* (2013.01); *G11C 7/106* (2013.01); *G11C 7/1006* (2013.01); *G11C 7/1069* (2013.01); *G11C 7/1087* (2013.01); *G11C 7/1096* (2013.01); *G11C 7/12* (2013.01); *G11C 11/405* (2013.01);
(Continued)

(58) Field of Classification Search
CPC . G11C 11/406; G11C 11/2211; G11C 11/418; G11C 11/2259; G11C 11/1659
See application file for complete search history.

(56) References Cited

U.S. PATENT DOCUMENTS 4,763,026 A    8/1988  Tsen
5,007,022 A *  4/1991  Leigh ...................... G11C 8/16
                                                   365/149

(Continued)

FOREIGN PATENT DOCUMENTS

JP    S51-104279    9/1976

*Primary Examiner* — Mushfique Siddique
(74) *Attorney, Agent, or Firm* — Winston Hsu

(57) ABSTRACT

The beginning of using Complementary Metal-Oxide-Semiconductor (CMOS) process technology to implement Static Random-Access Memory (SRAM) which transistor number is six. And then reducing transistor number for increasing integration density, but it will diminish the stability of memory, and also may enhance the complexity of access circuit, thus increasing the power consumption. For increasing the integration density of SRAM, and according to the electrical characteristics of reduced transistor number therefore designing the memory possess low power consumption and its corresponding circuits, and then implementing an access system. If electrical characteristic of the other various memories are similar to SRAM, such as Dynamic Random-Access Memory (DRAM), so they can also use the corresponding access circuit of SRAM.

4 Claims, 10 Drawing Sheets

(51) Int. Cl.
*G11C 11/408* (2006.01)
*G11C 11/406* (2006.01)
*G11C 11/409* (2006.01)
*G11C 11/4094* (2006.01)
*G11C 11/412* (2006.01)
*G11C 7/10* (2006.01)
*G11C 7/12* (2006.01)
*G11C 5/14* (2006.01)
*G11C 11/4074* (2006.01)
*G11C 11/4093* (2006.01)
*G11C 11/4096* (2006.01)
*G11C 11/405* (2006.01)

(52) U.S. Cl.
CPC .......... *G11C 11/406* (2013.01); *G11C 11/408* (2013.01); *G11C 11/409* (2013.01); *G11C 11/4074* (2013.01); *G11C 11/4085* (2013.01); *G11C 11/4087* (2013.01); *G11C 11/4093* (2013.01); *G11C 11/4094* (2013.01); *G11C 11/4096* (2013.01); *G11C 11/412* (2013.01); *G11C 11/418* (2013.01); *G11C 2211/4066* (2013.01)

(56) References Cited

U.S. PATENT DOCUMENTS

| | | | |
|---|---|---|---|
| 5,390,145 | A | 2/1995 | Nakasha |
| 6,229,161 | B1* | 5/2001 | Nemati ............... G11C 11/39 257/133 |
| 7,054,191 | B1* | 5/2006 | Gupta ................. G11C 11/39 365/175 |
| 9,093,175 | B2 | 7/2015 | Barth, Jr. |
| 10,482,951 | B2* | 11/2019 | Tang ................... G11C 7/1087 |
| 2006/0198181 | A1 | 9/2006 | Luk |
| 2007/0211535 | A1* | 9/2007 | Kim ................... G11C 11/404 365/185.21 |
| 2007/0211549 | A1 | 9/2007 | Kobayashi |
| 2007/0249115 | A1* | 10/2007 | Luk .................. H01L 27/10873 438/238 |
| 2008/0304339 | A1* | 12/2008 | Dietrich ............... G11C 13/00 365/189.16 |
| 2011/0255360 | A1* | 10/2011 | Takahashi ........... G11C 11/406 365/219 |
| 2013/0155793 | A1* | 6/2013 | Schreiber ........... G11C 11/418 365/194 |
| 2014/0321218 | A1 | 10/2014 | Luthra |

* cited by examiner

251

Input:

Output:

Input:

Output:

252

Input:

Output:

ACCESS DEVICE AND ASSOCIATED STORAGE DEVICE FOR PERFORMING REWRITE OPERATION BASED ON TRIGGER LEVEL

CROSS REFERENCE TO RELATED APPLICATIONS

This continuation application claims the benefit of U.S. non-provisional application Ser. No. 15/694,859 filed on Sep. 4, 2017. The entire contents of the related application are incorporated herein by reference.

BACKGROUND OF THE INVENTION

1. Field of the Invention

The present invention relates to a memory element of random-access memory, and more particularly, to semiconductor process technologies for implementing static random-access memories and dynamic random-access memories, and further for implementing the corresponding access circuits and access systems.

2. Description of the Prior Art

The earliest CMOS process technology for implementing Static Random-Access Memory (SRAM) utilizes six transistors, five transistors, then four transistors in advancement. Currently, Dynamic Random-Access Memory (DRAM), or more specifically, its structure is consisting of one transistor and one capacitor to forma storage cell, wherein DRAM is manufactured by special semiconductor process technology. Furthermore, the corresponding access circuit is relatively complicate which results in a poor performance of all.

The applicant has published the basic knowledge regarding the present invention in few journals of Taiwan, wherein the published data, the article name, the name of journal and the volume number are listed as follows:

"September 2005, "Logic Gate Design Developing Platform", *New Electronic Technology*, 234."

"October 2005, "Logic Gate Design Developing Platform (2)", *New Electronic Technology*, 235."

"December 2005, "Logic Gate Design Developing Platform (3)", *New Electronic Technology*, 237."

"July 2006, "Spread Pulse Trigger and ADS Simulation Technique", *Electronic and Computer*, 87."

"October 2006, "Memory Design and Exploration", *Electronic and Computer*, 90."

"May 2012, "The technique problem of 3T SRAM has a solution by taking advantage of CMOS", *New Electronic Technology.*"

The applicant also indicates all the limited teachings taught by the present invention are not revealed by aforementioned published documents; more specifically, the published documents only reveal the related basic concept and the contour, before the specific term and the related teaching specifically taught by the present invention are revealed, it is hard for those skilled in the art to learn all the limited teaching taught by the present invention, and also hard to implement the present invention by only learning from the prior art.

SUMMARY OF THE INVENTION

The present invention manufactures DRAM with standard semiconductor process technology, and its structure is consisting of one transistor and one diode, wherein the depletion capacitance of diode is utilized to form a capacitor. Furthermore, it cooperates with access circuit corresponding to SRAM. The performance of all is thus enhanced.

The present invention reduces the number of used transistors for elevating the integrated intensity for SRAM and expects using only three transistors in standard CMOS process technology to implement SRAM to overcome the stability of storage status and reduce the power consumption of memory, further, to implement related circuits and the corresponding access circuit and system.

On a motherboard of Personal Computer (PC), access time is greatly increased when DRAM operates in the period of reading data, and might be increased in the period of refreshing memory. Therefore, the Central Processing Unit (CPU) cannot immediately retrieve data from DRAM, thus all operating commands of CPU will be enforced stop after a data reading command. There are solutions for abovementioned problem is to switch threads, or add more space of cache memory in CPU, or use a cache memory with more hierarchies. One of the problems will be solved by the present invention is making SRAM be able to replace DRAM, or greatly enhance the performance of DRAM and reduce the hierarchy of cache memory.

For the motherboard of PC, the CPU has cache memory whose hardware circuit is implemented by SRAM. Another problem will be solved by the present invention is using this technology to implement cache memory for reducing layout area and power consumption.

The present invention is not limited solving aforementioned problems. Those skilled in the art should understand that the advantages and characteristic of the limited teaching taught by the present invention can be applied to the related products in the future, or replace the memory products relevant to the related art.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
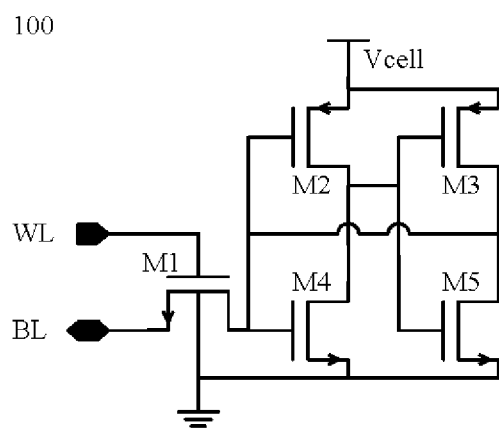
FIG. 1 is a circuit diagram illustrating a 5T SRAM cell in the prior art.

The following description should be read in conjunction with the corresponding figures. The associated embodiments for interpreting the novel technology of the present invention are basic models implemented based on said novel technology, which is not the only feasible embodiment to implement the present invention. To provide the novel technology of the present invention, the implementation comprises specific details for those skilled in the art to understand. However, those skilled in the art will understand that the present invention can still be implemented without using aforementioned specific details. Some well-known structures and elements are presented by block diagrams in some embodiments to avoid deflecting the highlight of the novel concept of the present invention.

The term "exemplary" mentioned in the following paragraphs means "as example, implementation or interpretation". As described as "exemplary", any embodiment should not be interpreted as an embodiment better than others or with more advantages. The term "hierarchical circuit" mentioned in the following paragraphs is used to describe a circuit diagram and/or a block diagram, which is a well-known design method in the electronic circuit field and the integrated circuit field. The term "terminal point" means a terminal point of the supply voltage, or the supply voltage may connect or couple to the terminal point. The term "node" means the supply voltage and any signal might couple between the hierarchy where the circuit positioned in and the last hierarchy, the farther hierarchy or the first hierarchy. More specifically, the specific circuit is positioned in one of the hierarchies in the hierarchical circuit, and it may couple to other elements or circuits beyond the hierarchy where the specific circuit is positioned. After the coupling, the hierarchy where the specific circuit is positioned becomes the next hierarchy. Furthermore, different circuit diagrams might use the same node name, but the node might couple to other places. The term "connective point" mentioned in the following paragraphs means a metal connecting point for physical connection between the electrical elements or electronic circuits.

The following introduces circuit symbols of transistor used in transistor-level design. The structure of transistor belongs to a Metal Oxide Semiconductor Field Effect Transistor (MOSFET) which comprises N-type MOSFET and P-type MOSFET; there are indicated as NMOS and PMOS in the following respectively. A symbol of MOSFET with four nodes comprises a source terminal, a drain terminal, a gate terminal and a bulk; the source terminal should be marked by an arrow, if not, it should be easily recognized. Another symbol of MOSFET with three nodes comprises a source terminal, a drain terminal and a gate terminal; the source terminal should be marked by an arrow, if not, it should be easily recognized, wherein the bulk without additional mark means it is directly connected to the source terminal. According to CMOS process technology, a bulk can be grouped into P-type substrate and N-type substrate, wherein the p-type substrate is commonly used. Therefore, when the N-type substrate is applied, aforementioned NMOS needs to be replaced by PMOS, vice versa. In addition, the terminal point originally coupled to the supply voltage needs to couple to the ground instead, vice versa.

Static Random-Access Memory Cell:

Static Random-Access Memory cell, hereinafter "SRAM cell", is a memory element of random-access memory.

Refer to FIG. 1, an SRAM cell 100 is consisting of five transistors under transistor-level design, which will be stated as "5T SRAM cell" in the following. In FIG. 1, M1 to M5 are a MOSFET respectively stated as first to fifth transistor, wherein M1, M4 and M5 are a NMOS while M2 and M3 are a PMOS. Said transistors are formed a storage cell, and M1 is also the access transistor.

An input or output node: Bit Line, hereinafter "BL", is a data node arranged to input or output a bit data value.

An input node: Word Line, hereinafter "WL", is an address node arranged to control writing or reading said bit data value.

An input node: A supply voltage of cell, stated as "Vcell", is a cell power terminal point to accept a suitable voltage to perform a write or read operation.

The 5T SRAM cell 100 comprises a data transmission node, a transmission control node, a cell power terminal point, a ground terminal point, a first transistor, a second transistor, a third transistor, a fourth transistor, and a fifth transistor. The wiring net of said memory element is shown in FIG. 1 which is a well-known prior art. The detailed description is omitted.

The 5T SRAM cell is a memory element of prior art, wherein a first inverter is consisting of M2 and M4, and a second inverter is consisting of M3 and M5. Said first inverter and said second inverter are used to latch data by feedback connection. The detailed interpretation can be referred to the journal "October 2006, "Memory design exploration", *Electronic and Computer*, 90".

Figure 2:
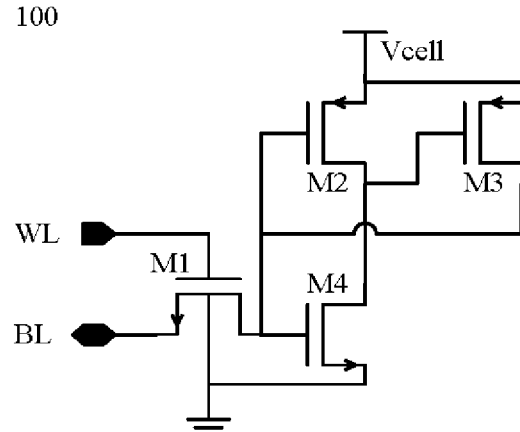
FIG. 2 is a circuit diagram illustrating a 4T SRAM cell in the prior art.

Refer to FIG. 2, an SRAM cell 100 is consisting of four transistors under transistor-level design, which will be stated as "4T SRAM cell" in the following. In FIG. 2, M1 to M4 are a MOSFET respectively stated as first to fourth transistor, wherein M1 and M4 are a NMOS while M2 and M3 are a PMOS. The other nodes are similar with those in FIG. 1.

The 4T SRAM cell 100 comprises a data transmission node, a transmission control node, a cell power terminal point, a ground terminal point, a first transistor, a second transistor, a third transistor, and a fourth transistor. The wiring net of said memory element is shown in FIG. 2 which is well-known prior art. The detailed description is omitted.

The 4T SRAM cell is a single rail and robust memory, that is, a logic level has strong stability while another has weak stability. The retention of the 4T SRAM cell rely on leakage current of transistor. When M3 is cut off, there is still a leakage current between source terminal and drain terminal of M3. Said current flows to source terminal of M1 from the drain terminal, finally to said ground terminal point via BL. In addition, there is also a reverse current of diode between drain terminal and bulk of M1, that is, a bulk current arranged to stabilize said bit data value. When M1 is cut off, leakage current and bulk current of M1 and working current of M3 constitute a first current path, wherein said first current path equals a first inverter; working current of M4 and working current of M2 constitute a second current path, and M4 is dynamically controlled causing a strong pull-low current. Said second current path equals a second inverter; said first inverter and said second inverter are used to latch data by feedback connection. The detailed interpretation can be referred to the journal "October 2006, "Memory design exploration", *Electronic and Computer,* 90".

Figure 3:
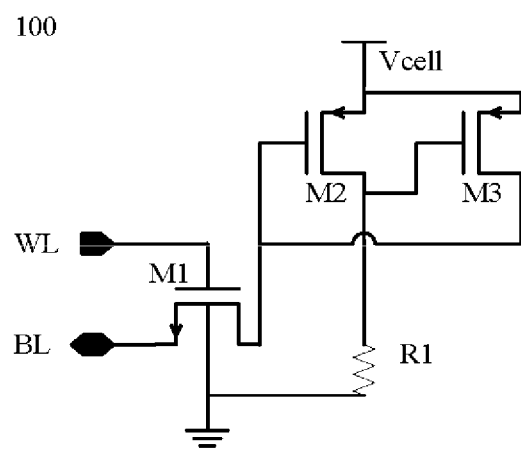
FIG. 3 is a circuit diagram illustrating a 3T1R SRAM cell in the prior art.

Refer to FIG. 3, an SRAM cell 100 is consisting of three transistors and one resistor under transistor-level design, which will be stated as "3T1R SRAM cell" in the following. In FIG. 3, M1 to M3 are a MOSFET respectively stated as first to third transistor, wherein M1 is an NMOS while M2 and M3 are a PMOS, and R1 is a resistor comprising a first connective point and a second connective point. Said transistors and said resistor are formed a storage cell. The other nodes are similar with those in FIG. 1 and FIG. 2.

The 3T1R SRAM cell 100 comprises a data transmission node, a transmission control node, a cell power terminal point, a ground terminal point, a first transistor, a second transistor, a third transistor, and a first resistor. The wiring net of said memory element is shown in FIG. 3 which is a well-known prior art. The detailed description is omitted.

The retention of the 3T1R SRAM cell is not only rely on leakage current of transistor to stabilize said bit data value, but also the resistance of R1 for cooperating with dynamical variation of M2. Because M2 has low resistance when turned on but has high resistance when cut off, thus resistance of R1 cannot be too high or too low. However, it's hard for standard CMOS process technology to manufacture a resistor with high resistance. The 3T1R SRAM cell, therefore, is hard to be implemented in standard process technology. When M1 is turned on, said storage cell rapidly loses the ability of latching data. When M1 is cut off, leakage current and bulk current of M1 and working current of M3 constitute a first current path, wherein said first current path equals a first inverter; the current passing through R1 and working current of M2 constitute a second current path, and there is also a middle pull-low current, wherein said second current path equals a second inverter; said first inverter and said second inverter are arranged to latch data by feedback connection. The detailed interpretation can be referred to the journal "May 2012, "The technique problem of 3T SRAM has a solution by taking advantage of CMOS", *New Electronic Technology*".

Figure 4:
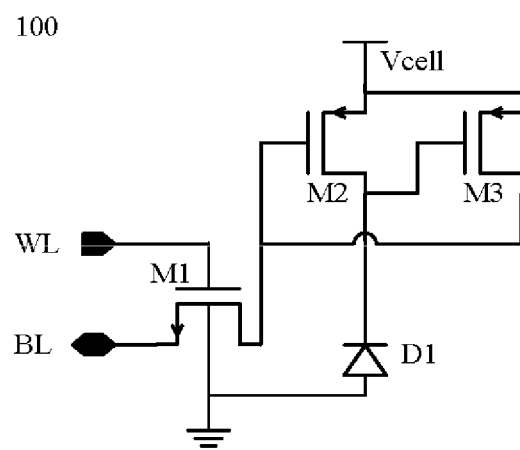
FIG. 4 is a circuit diagram illustrating a 3T1D SRAM cell according to an embodiment of the present invention.

The first embodiment of the present invention: Refer to FIG. 4, an SRAM cell 100 is consisting of three transistors and one diode under transistor-level design, which will be stated as "3T1D SRAM cell" in the following. In FIGS. 4, M1 to M3 are a MOSFET respectively stated as first to third transistor, wherein M1 is an NMOS while M2 and M3 are a PMOS, and D1 is a diode comprising an anode and a cathode. The anode is called a first connective point and the cathode is called a second connective point. The other nodes are similar with those in FIG. 1-FIG. 3.

The 3T1D SRAM cell 100 comprises a data transmission node, a transmission control node, a cell power terminal point, a ground terminal point, a first transistor, a second transistor, a third transistor, and a first diode.

The wiring net of said first transistor is described as follows: the source terminal couples to said data transmission node; the gate terminal couples to said transmission control node; the drain terminal connects to gate terminal of said second transistor and drain terminal of said third transistor; and the bulk connects to said ground terminal point.

The wiring net of said second transistor is described as follows: the source terminal connects to said cell power terminal point; the gate terminal connects to drain terminals of said first and said third transistors; and the drain terminal connects to gate terminal of said third transistor and second connective point of said first diode.

The wiring net of said third transistor is described as follows: the source terminal connects to said cell power terminal point; the gate terminal connects to drain terminal of said second transistor and second connective point of said first diode; the drain terminal connects to drain terminal of said first transistor and gate terminal of said second transistor.

The wiring net of said first diode is described as follows: the first connective point connects to said ground terminal point; the second connective point connects to drain terminal of said second transistor and gate terminal of said third transistor.

The characteristic of 3T1D SRAM cell is different from 5T SRAM cell, 4T SRAM cell and 3T1R SRAM cell mentioned above. The difference is caused by said first diode, wherein the wiring net of D1 generates a reverse current which is a weak current and affected by temperature. M2 and M3 are varied according to reverse current of D1, for example, the special process parameters such as the thickness of gate oxide. Alternatively, M2 and M3 are implemented by another standard process technology to change transistor type, for example, the transistor with high threshold voltage. Accordingly, when M1 is varied based on the variation of M2 and M3, it reduces power consumption of the cell. When M1 is turned on, said storage cell rapidly loses the ability of latching data. When M1 is cut off, leakage current and bulk current of M1 and working current of M3 constitute a first current path, wherein said first current path equals a first inverter; reverse current of D1 and working current of M2 constitute a second current path, and there is a weak pull-low current, wherein said second current path equals a second inverter; said first inverter and said second inverter are arranged to latch data by a feedback connection.

The CMOS process technology can manufacture several diode types such like "n+/p-well", "p+/n-well", "n-well/p-sub" and "ESD", wherein D1 has a limitation for layout area, and also has to correspond to the current difference resulted from the variation of M2 and M3 due to temperature. Therefore, the most use of diode type is "n+/p-well" in general situation which has a smaller layout area and a better stability. In addition, when layout area of D1 is not limited, a varactor may be used to stand high operating temperature. Those skilled in the art should readily understand that when the layout area is not limited, different diodes, capacitors, resistors or other elements with leakage current can be connected in series or parallel after reading the embodiments shown above.

Figure 5:
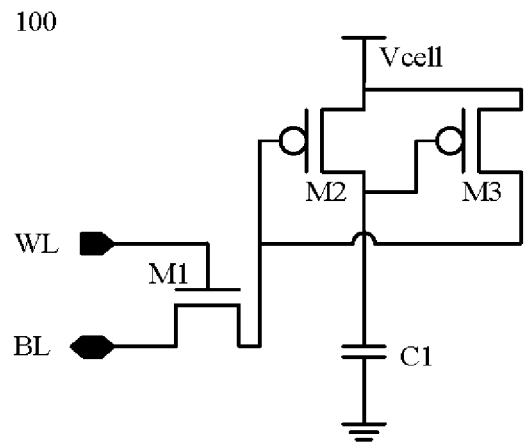
FIG. 5 is a circuit diagram illustrating a 3T1C SRAM cell according to an embodiment of the present invention.

The second embodiment of the present invention: refer to FIG. 5, an SRAM cell 100 is consisting of three transistors and one capacitor under transistor-level design, which will be stated as "3T1C SRAM cell" in the following. Please note that this embodiment will be easier to implemented by Silicon-On-Insulator (SOI) process technology, and the produced transistor has no bulk. In FIG. 5, M1 to M3 are a MOSFET respectively stated as first to third transistor, wherein M1 is an NMOS while M2 and M3 are a PMOS, and C1 is a capacitor comprising a first connective point and a second connective point. The other nodes are similar with those in FIG. 1-FIG. 4.

The 3T1C SRAM cell comprises a data transmission node, a transmission control node, a cell power terminal point, a ground terminal point, a first transistor, a second transistor, a third transistor, and a first capacitor. The wiring net can be referred to aforementioned 3T1D SRAM cell 100, the detailed description is omitted here.

The 3T1C SRAM cell has more low leakage current due to the SOI process technology. Therefore, reducing the oxide thickness of C1 might increase direct tunneling current. This adjustment is arranged for matching leakage current of said transistors and direct tunneling current of said capacitor as mentioned in the 3T1D SRAM cell. When M1 is cut off, leakage current of M1 and working current of M3 constitute a first current path, wherein said first current path equals a first inverter; direct tunneling current of C1 and working current of M2 constitute a second current path, wherein said second current path equals a second inverter, and there is a weak pull-low current; said first inverter and said second inverter are arranged to latch data by a feedback connection. Those skilled in the art should understand the type and the parameter of the transistors can be designed based on the type and the parameters of the diodes to improve the performance, reduce consumed area or minimize the power consumption after reading those embodiments above; apparently, the type and the parameter of the transistors can also be designed based on the type and the parameters of the capacitors.

The following explains an acceptable working voltage for SRAM cell mentioned above. There is a normal voltage, a writing voltage, a reading voltage and a standby voltage, wherein normal voltage is arranged to maintain storage status of the memory element when there is no data being accessed; writing voltage is arranged to reduce time of status transformation when data is written into the memory element; reading voltage is arranged to enhance signal strength when data is read from the memory element; standby voltage is arranged to reduce power consumption. The voltage level of these voltages acceptable for the 5T SRAM cell, 4T SRAM cell and 3T1R SRAM cell are described as follows: said reading voltage is higher than or equals said normal voltage, said normal voltage is higher than or equals said writing voltage, and said writing voltage is higher than or equals said standby voltage. The 3T1D SRAM cell and 3T1C SRAM cell fully rely on leakage current of transistor to maintain storage status of the memory element. Therefore, the working voltage cannot be too weak, or there is not enough leakage current to maintain storage status of the memory element. However, to destroy storage status of the memory element when writing data, so the voltage level of acceptable working voltages is described as follows: said reading voltage is higher than or equals said normal voltage, said normal voltage is higher than or equals said standby voltage, and said standby voltage is higher than or equals said writing voltage. Those skilled in the art should readily understand that aforementioned memory elements can be slightly changed to implement the dual-port access. For example, a data transmission node, a transmission control node and a transistor may be additionally added; said transistor is also the access transistor.

Cell Access and Hold:

The Cell Access and Hold (CAH) is a type of access circuit, comprising a hold circuit which is positioned between aforementioned memory element and memory transmission interface, and is arranged to write a bit value into aforementioned memory element, or read a bit value from aforementioned memory element. In addition, said bit value stored in aforementioned memory element is held according to the characteristic of aforementioned memory element.

Figure 6:
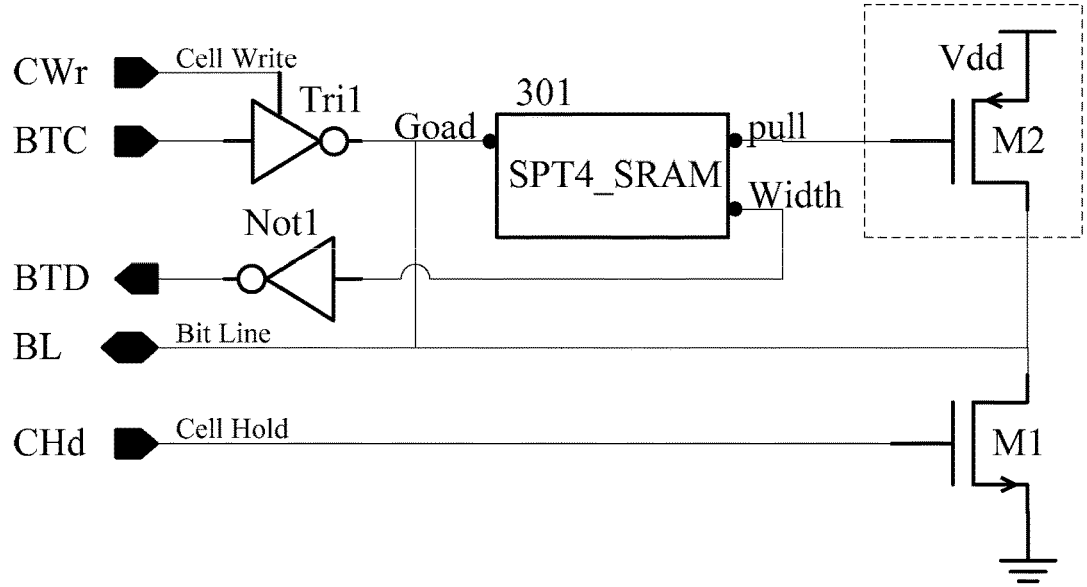
FIG. 6 is a circuit diagram illustrating Cell Access and Hold according to an embodiment of the present invention.

The third embodiment of the present invention: refer to FIG. 6, which is an exemplary circuit diagram, wherein the Cell Access and Hold 300 (CAH 300) is a circuit diagram combining transistor-level design, gate-level design and function blocks. M1 and M2 are a MOSFET respectively stated as first and second transistor, wherein M1 is NMOS while M2 is PMOS. In FIG. 6, Tri1 is tri-state gate; Not1 is NOT gate.

SPT_SRAM 301 is a function block diagram, arranged to detect BL. When BL is slightly increased to high voltage from a relatively low voltage, a rail-to-rail high voltage is quickly outputted. This will be discussed in the following paragraphs. In FIG. 6, "Goad" is a first input connective point, "Width" is a first output connective point, and "pull" is a second output connective point.

An input node: Cell Write, hereinafter "CWr", is a control node arranged to start function of cell write, and change storage status of aforementioned memory element.

An input node: Cell Hold, hereafter "CHd", is a control node arranged to start function of cell hold, and maintain storage status of aforementioned memory element.

An input node: Bit-To-Cell, hereinafter "BTC", is a data node arranged to write a bit value into aforementioned memory element.

An output node: Bit-To-Data, hereinafter "BTD", is a data node, arranged to read a bit value from aforementioned memory element.

The other nodes are similar as those in abovementioned embodiments.

The following maneuvers should be read in conjunction with FIG. 6 to explain how to combine those electrical elements to implement a function of cell write: CWr enables Tri1; BTC sends a bit value to Tri1; Tri1 transfers said bit value to BL and simultaneously to Goad of SPT4_SRAM 301; when Goad of SPT4_SRAM 301 detects a voltage higher than the trigger level, pull of SPT4_SRAM 301 decreases to low voltage to drive M2. After M2 is turned on, a stronger voltage is provided to BL to stabilize storage status of aforementioned SRAM cell 100. Further, this implementation can reduce writing time. Please note that this embodiment is a preferable embodiment, those skilled in the art should understand that those electrical elements can be separated from and further coupled to the cell read circuit according to actual design consideration. In addition, M2 in the CAH 300 is an optional element for 5T/4T SRAM cell, however, it is necessary for 3T1R/3T1D/3T1C SRAM cell, because aforementioned memory element might be influenced by the neighborhood writing to change storage status, which is the most significant difference between 3T1R/3T1D/3T1C SRAM cell and 5T/4T SRAM cell.

The following maneuvers should be read in conjunction with FIG. 6 to explain how to combine those electrical elements to implement a function of cell read: after WL in aforementioned SRAM cell 100 enables M1 in aforementioned SRAM cell 100, storage status of aforementioned SRAM cell 100 is sent to BL; Goad of SPT4_SRAM 301 constantly receives from BL, and transfer said storage status from Width of SPT4_SRAM 301 to BTD, wherein Not1 is configured to be a buffer; when Goad of SPT4_SRAM 301 detects the voltage higher than the trigger level, pull of SPT4_SRAM 301 decreases to low voltage to drive M2. After M2 is turned on, a stronger voltage is provided to BL to stabilize the storage status of aforementioned SRAM cell 100. Please note that this embodiment is a preferable embodiment, those skilled in the art should understand that those electrical elements can be separated from and further coupled to the cell write circuit according to actual design consideration. In addition, M2 in the CAH 300 is an optional element for 5T/4T SRAM cell, however, it is necessary for 3T1R/3T1D/3T1C SRAM cell, because aforementioned memory element might be influenced by the neighborhood reading to change storage status, furthermore, it may happen destructive readout. These are the most significant differences between 3T1R/3T1D/3T1C SRAM cell and 5T/4T SRAM cell.

The following maneuvers should be read in conjunction with FIG. 6 to explain how to combine those electrical elements to implement a function of cell hold: CHd drives M1; after M1 is turned on, voltage level of BL is held to low voltage and leakage current of M1 in aforementioned SRAM cell 100 reaches ground terminal point. Please note this embodiment is a preferable embodiment, those skilled in the art should understand those electrical elements can be separated from and further coupled to the cell access circuit according to actual design consideration. In addition, M1 in CAH 300 is necessary for aforementioned memory elements because the key point for aforementioned elements being able to implement data storage is using leakage current of transistor to maintain storage status. For the 5T SRAM cell, the existence of M1 can enhance the stability after it enters standby; for 4T/3T1R/3T1D/3T1C SRAM cell, M1 is the necessary element. Those skilled in the art should understand signal waveform of CHd is not a limitation of present invention, wherein in a simple embodiment, M1 is constantly driven, but in the situation for storage status is not being destroyed immediately, M1 can be driven intermittently, or even be driven based on practical situation.

A circuit of CAH 300 comprises (but not limited to) a first control node, a second control node, a first data node, a second data node, a data transmission node, a power terminal point, a ground terminal point, a first tri-state gate, a first NOT gate, a first function circuit, a first transistor, and a second transistor.

The following explains how to perform the cell write operation and the cell hold operation. Initially, said first control node keeps disabling function of cell write, and said second node keeps enabling function of cell hold. At this period, it is in the phase of cell hold, wherein said second control node drives said first transistor to complete cell hold operation. In step one, said second control node disables function of cell hold, and said first control node enables function of cell write. The working phase of cell write is entered. In step two, data value of said first data node is sent to said data transmission node, then cell write operation is completed. In step three, said first control node disables function of cell write first, and said second control node enables function of cell hold. The working phase of cell hold is entered.

The following explains how to perform the cell read operation and the cell hold operation. Initially, said second control node keeps enabling function of cell hold. At this period, it is in the working phase of cell hold, wherein said second control node drives said first transistor to complete cell hold operation. In step one, said second control node disables function of cell hold after the working phase of cell read is entered. To avoid destructive readout, disabling function of cell hold should be executed immediately. In step two, said second data node receives data value of said data transmission node, then cell read operation is completed. In step three, said second control node enables function of cell hold after cell read is completed. The working phase of cell hold is thus retained afterward. To avoid the destructive readout, enabling function of cell hold should be executed immediately.

The circuit of CAH and the corresponding method disclosed by the present invention should cooperate with aforementioned SRAM cell 100, wherein methods of writing and reading may correspond to the same access circuit, but may correspond to different access circuits on the other hand. However, the type of memory elements for said circuit and the corresponding methods cooperate with is not limited in the present invention. If other memory elements have similar characteristics with aforementioned SRAM cell 100, they can be directly applied or be slightly adjusted according to its characteristic. For example, the circuit and the corresponding method can be designed according to the characteristic of a DRAM cell. Using the circuit of CAH to read a DRAM cell can complete rewrite operation during reading period. In this way, the Write-After-Read architecture can be removed. In addition, the noise margin may be enhanced which is the advantage of combining said first transistor and said first function circuit. The DRAM cell may be implemented by 1T1C, 1T-SOI or by using a depletion capacitance of diode to complete 1T1D. The depletion capacitance is smaller and said reverse current influenced by the temperature occurs, however, a storage benefit can be owned when the access technique proposed by the present invention is applied. When the circuit disclosed by the present invention cooperates with DRAM cells, the transistor in said cells can adjust some process parameters. For example, said cells may use transistor with high threshold voltage to reduce leakage current. However, the circuit disclosed by the present invention still can use transistor with low threshold voltage without elevating supply voltage for BL and WL. In other words, when said cell is written into a first logic level, the storage status of said cell maintains at the logic level. However, when said cell is written into a second logic level, the storage status of said cell gradually changes to the first logic level, wherein the first logic level and the second logic level correspond to logic values '0' and '1', respectively.

Figure 21:
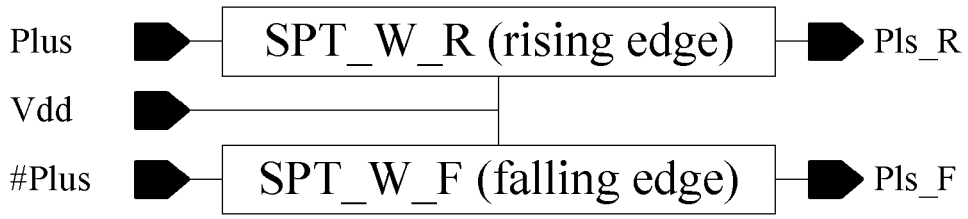
FIG. 21 is a diagram illustrating a waveform of SPT_W regarding the pulse signal.
Figure 21:
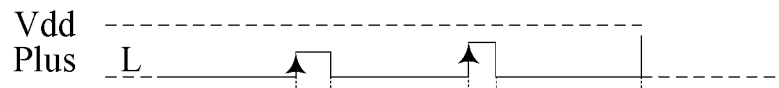
Figure 21:
Figure 21:
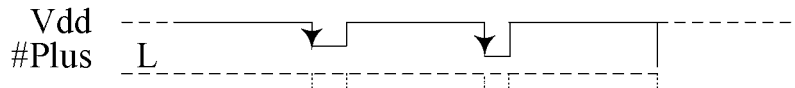
Figure 21:
Figure 22:
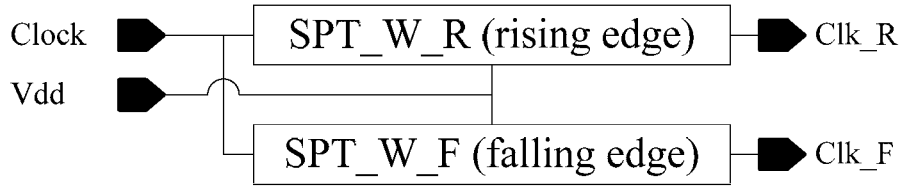
FIG. 22 is a diagram illustrating a waveform of SPT_W regarding the clock signal.
Figure 22:
Figure 22:
Figure 22:
Figure 23:
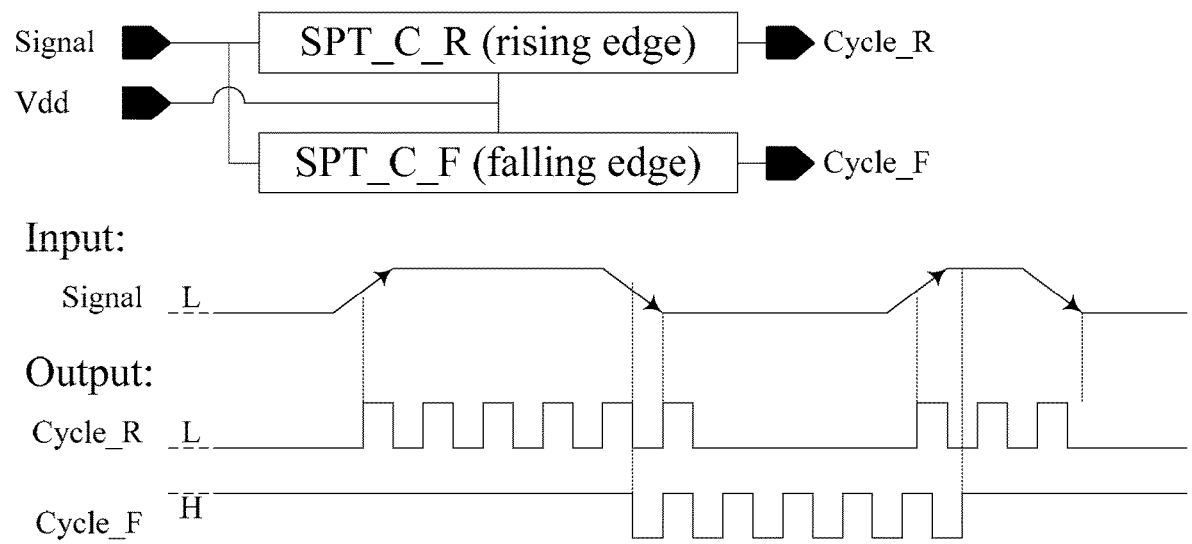
FIG. 23 is a diagram illustrating a waveform of SPT_C.

Spread Pulse Trigger:

The Spread Pulse Trigger, hereinafter "SPT", is arranged to regard a voltage variation or a pulse width as a trigger to generate a pulse signal of rail-to-rail; wherein, the minimum voltage variation is close to zero, and the narrowest pulse width may smaller than a propagation delay of transistor. More specifically, when the voltage of the input node increases to a trigger level from low voltage level, or on the contrary, decreases to the trigger level from high voltage. In other words, the trigger signal is triggered when the voltage level on the input node changes to a second voltage level from a first logic level, then the logic level on the output node is quickly and greatly switched. Lastly, a pulse signal of rail-to-rail is outputted. The logic level is defined as the input voltage level or the output voltage level of a digital circuit, and the second voltage level is defined as a voltage value different from the first logic level and its voltage polarity is contrary to that of the first logic level. The internal circuit in SPT, before being improved, generates a pulse signal of rail-to-tail, and output waveform of said circuit is generated by transforming time of said trigger signal into corresponding pulse width, therefore, it is marked as "SPT_W". The exemplary waveforms can be referred to FIG. 21 and FIG. 22. After being improved, a clock signal of rail-to-rail is generated, wherein output waveform of said circuit is generated by cyclically producing pulse signals based on time of said trigger signal, therefore, it is marked as "SPT_C". The exemplary waveform can be referred to FIG. 23. In addition, those skilled in the art should understand the relation between SPT_W and SPT_C after reading the teachings of the present invention, and understand that it is possible to add a control signal and a switching circuit to comprise both functions to select outputting a width waveform or a cyclical waveform, which is marked as "SPT_B". The detailed explanation and waveform can be referred to the journal "July 2006, "Spread Pulse Trigger and ADC simulation technique", *Electronic and Computer*, 87".

Figure 7:
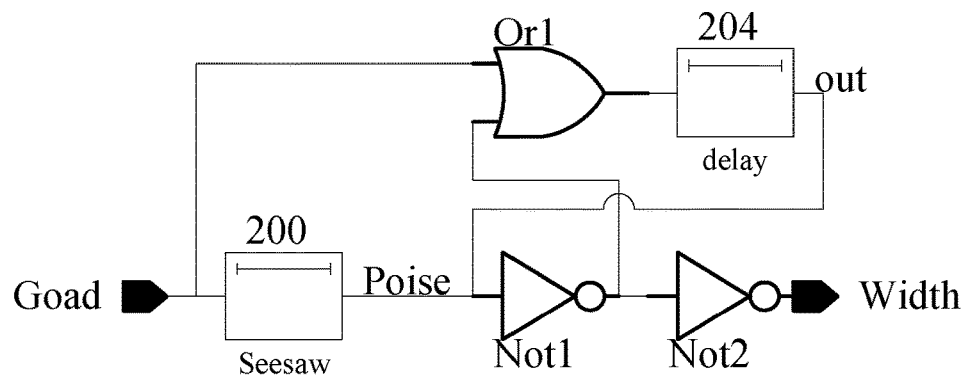
FIG. 7 is a diagram illustrating a circuit SPT_W according to an embodiment of the present invention.

The fourth embodiment of the present invention: refer to FIG. 7 which is an exemplary circuit diagram, wherein SPT_W 201 in FIG. 7 is a diagram combining gate-level design and function diagrams, Or1 is OR gate and Not1 and Not2 are NOT gates. Seesaw 200 is a function diagram arranged to switch the logic level quickly and greatly, and is also called a Level Switcher (LS). The detailed description will be discussed in the follow paragraphs. Seesaw 200 comprises a first input connective point and a first output connective point which name is "Poise". The delay 204 is a delay element arranged to delay the transforming time, comprising: a first input connective point and a first output connective which name is "out". In the preferable embodiment, time of falling-edge transformation (i.e. time from high to low) is delayed which can be implemented by a Falling-edge Delay Turner. This can be referred to the journal "September 2005, "Logic Gate Design Developing Platform", *New Electronic Technology*, 234".

An input node: Goad, which is a signal node for taking the slight voltage variation as the trigger level.

An output node: Width, which is a signal node for outputting a pulse signal of rail-to-rail generated by transforming time of the trigger signal into the corresponding pulse width.

The circuit of SPT_W 201 at least comprises a first input node, a first output node, a first LS, a first NOT gate, and a first OR gate, wherein said first LS comprises a first input connective point, a first output connective point, and selectively comprises at least a delay element comprising a first input connective point and a first output connective point.

The wiring net of said first LS is described as follows: the first input connective point couples to said first input node and first input connective point of said first OR gate; the first output connective point connects to first input connective point of said first NOT gate, and couples to first output connective point of said first OR gate, and selectively connects to first output connective point of said delay element.

The wiring net of said first NOT gate is described as follows: the first input connective point connects to first output connective point of said first LS, and couples to first output connective point of said first OR gate, and selectively connected to first output connective point of said delay element; the first output connective point couples to second input connective point of said first OR gate and said first output node.

The wiring net of said first OR gate is described as follows: the first input connective point couples to said first input node and first input connective point of said first LS; the second input connective point couples to first output connective point of said first NOT gate; and the first output connective point couples to first output connective point of said first LS and first input connective point of said first NOT gate, and selectively connects to first input connective point of said delay element.

The wiring net of said delay element is described as follows: the first input connective point connects to first output connective point of said first OR gate; the first output connective point connects to first output connective point of said first LS and first input connective point of said first NOT gate.

The following steps explains how SPT_W 201 detects the trigger level and generates a pulse signal of rail-to-rail, wherein the first logic level is different and contrary to the second logic level, and the third logic level is different and contrary to the fourth logic level. The definition of the second voltage value is a voltage different from the first logic level and its voltage polarity is contrary to that of the first logic level.

Initially, said first input node (Goad) holds on the first logic level, said first LS outputs the first logic level while said first NOT gate outputs the second logic to make said first OR gate output the second logic level. The output connective point of said first LS and the output connective point of said first OR gate constitute a wired-AND therefore said first NOT gate constantly outputs the second logic level. Said first output node (Width) holds on the third logic level.

In step one, said first input node changes to the second voltage value from the first logic level, or changes back to the first logic level in a predetermined period after being on the second voltage value.

In step two, said first LS detects the variation of the first input node, then switches the first logic level to the second logic level instantly, and outputs the second logic level.

In step three, said first NOT gate affected by the wired-AND therefore switches the second logic level to the first logic level while said first output node is switched to the fourth logic level from the third logic level.

In step four, if said first input node is located on the second logic level, said first OR gate is located on the second logic level, said delay element is located on the second logic level, said first NOT gate is located on the first logic level, and said first output node is located on the fourth logic level.

In step five, after said first input node changes back to the first logic level, said first NOT gate outputs the second logic level after said delay element turns back to the first logic level, said first output node outputs the third logic level after said first LS turns back to the first logic level, then the function of spreading pulse width is completed.

Figure 8:
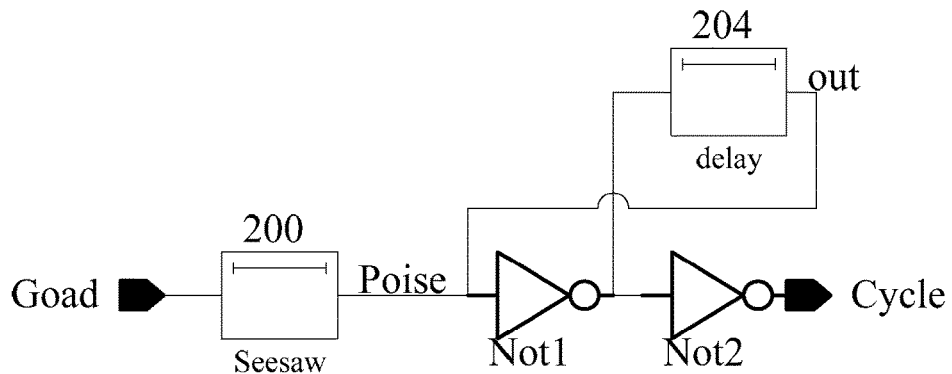
FIG. 8 is a diagram illustrating a circuit SPT_C according to an embodiment of the present invention.

The fifth embodiment of the present invention: refer to FIG. 8, which is an exemplary circuit diagram combining gate-level design and function diagrams, wherein Not1 and Not2 are NOT gates.

An output node: Cycle, which is a signal node for outputting a clock signal of rail-to-rail generated by cyclically producing pulse signals based on time of the trigger signal. The other nodes are similar with those in the above embodiment.

The circuit of SPT_C 202 at least comprises a first input node, a first output node, a first LS, a first NOT gate, and a delay element, wherein said first LS comprises a first input connective point, a first output connective point, and said delay element comprises a first input connective point and a first output connective point.

The wiring net of said first LS is described as follows: the first input connective point couples to said first input node; the first output connective point connects to first input connective point of said first NOT gate and first output connective point of said delay element.

The wiring net of said first NOT gate is described as follows: the first input connective point connects to first output connective point of said first LS and first output connective point of said delay element; the first output connective point couples to first input connective point of said delay element and said first output node.

The wiring net of said delay element is described as follows: the first input connective point couples to first output connective point of said NOT gate; the first output connective point connects to first output connective point of said first LS and first input connective point of said first NOT gate.

The following explains how SPT_C 202 detects the trigger level and generates a clock signal of rail-to-rail, wherein the definition of the first logic level, the second logic level, the third logic level, the fourth logic level, and the second voltage value are same as the SPT_W 201.

Initially, said first input node (Goad) holds on the first logic level, and said first LS outputs the first logic level while said first NOT gate outputs the second logic level to make said delay element output the second logic level. The output connective point of said first LS and the output connective point of said delay element constitute a wired-AND therefore said first NOT gate constantly outputs the second logic level, and said first output node (Cycle) holds on the third logic level.

In step one, said first input node changes to the second voltage value from the first logic level, or changes back to the first logic level in a predetermined period after being on the second voltage value.

In step two, said first LS detects the variation of the first input node, and switches the first logic level to the second logic level, then outputs the second logic level.

In step three, said first NOT gate affected by the wired-AND and switches the second logic level to the first logic level. Said first NOT gate and said delay element constitute an oscillator. Said first output node is alternatively changed between the third logic level and the fourth logic level.

In step four, if said first input node is located on the second logic level, said first NOT gate and said first output node cyclically output the pulse signal.

In step five, after said first input node changes back to the first logic level, said first NOT gate outputs the second logic level after said delay element turns back to the first logic level, and said first output node outputs the third logic level after said first LS turns back to the first logic level, then the pulse signal is stopped being produced.

Changing the logic gates based on the circuits of SPT_W 201 and SPT_C 202 can implement the detection and the output of the inverse voltage. This method is implemented according to the complementary of the logic gates. Those skilled in the art should understand that the first input connective point of said first OR gate in SPT_W 201 can be connected to a switching circuit and the output signal can be selected by a control signal after reading abovementioned implementation. If said first input connective point couples to first input node of said circuit via said switching circuit, the function of SPT_W 201 is acquired. If said first input connective point couples to second input connective point of said first OR gate via said switching circuit, the function of SPT_C 202 is acquired.

Figure 9:
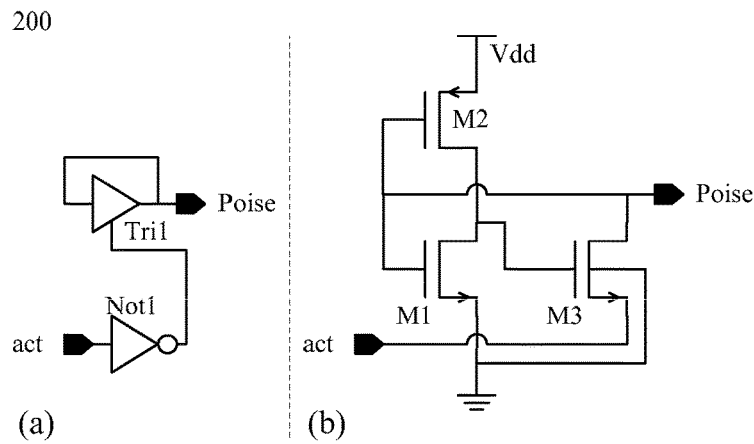
FIG. 9 is a diagram illustrating a Seesaw circuit according to an embodiment of the present invention.

The sixth embodiment of the present invention: the following explains a circuit of aforementioned LS. Said circuit pulls the voltage up and down like a seesaw, so in the following paragraphs it is marked as "Seesaw" for brevity. Refer to FIG. 9, which is an exemplary circuit diagram. The Seesaw 200(*a*) is a circuit implemented in gate-level design, wherein Tri1 is tri-state gate, and Not1 is NOT gate. The Seesaw 200(*b*) is a circuit consisting of three transistors under transistor-level design, wherein M1 to M3 are a MOSFET respectively stated as first to third transistor. M1 and M3 are a NMOS while M2 is PMOS.

An input node: action, hereinafter "act", is a control node for starting to pull voltage up or down like a tilt seesaw.

An input and output node: Poise, which is a signal node for resuming the voltage, like balancing the tilt seesaw.

The circuit of Seesaw 200(*a*) comprises a first action node, a first poise node and a tri-state gate, wherein said tri-state gate comprises an enable connective point, an input connective point and an output connective point.

The wiring net of said tri-state gate is described as follows: the enable connective point couples to said first action node; the input connective point connects to said output connective point, and couples to said first poise node; the output connective point connects to said input connective point, and couples to said first poise node.

The following flow should be read in conjunction with FIG. 7 and FIG. 8 to explain the maneuver of Seesaw 200(*a*) in FIG. 9, wherein the definition of the first logic level, the second logic level, the third logic level, and the fourth logic level are same as the SPT_W 201.

Initially, the first logic level on said first action node (act) keeps enabling Tri1, and said first poise node (Poise) locates on the third logic level.

In step one, said first action node gradually transforms to the second logic level to disable Tri1, and said first poise node gradually escapes from the third logic level according to the fourth logic level inputted into Poise. After the voltage variation on said first action node reaches the trigger level, the voltage value on said first poise node quickly escapes from the third logic level according to the fourth logic level inputted into Poise.

In step two, said first action node turns back to the first logic level to enable Tri1.

In step three, as long as the voltage value inputted into said first poise node is still the fourth logic level, Poise locates on the fourth logic level.

In step four, after the voltage value inputted into said first poise node changes to the third logic level, Poise turns back to the third logic level.

The circuit of Seesaw 200(*b*) comprises a first action node, a first poise node, a power terminal point, a ground terminal point, a first transistor, a second transistor, and a third transistor.

The wiring net of said first transistor is described as follows: the source terminal connects to said ground terminal point; the gate terminal connects to gate terminal of said second transistor and drain terminal of said third transistor, and couples to said first poise node; and the drain terminal connects to drain terminal of said second transistor and gate terminal of said third transistor.

The wiring net of said second transistor is described as follows: the source terminal connects to said power terminal point; the gate terminal connects to gate terminal of said first transistor and drain terminal of said third transistor, and couples to said first poise node; and the drain terminal connects to drain terminal of said first transistor and gate terminal of said third transistor.

The wiring net of said third transistor is described as follows: the source terminal couples to said first action node; the gate terminal connects to drain terminal of said first and said second transistors; the drain terminal connects to gate terminal of said first and said second transistors, and couples to said first poise node; and the bulk connects to said ground terminal point.

The following flow should be read in conjunction with FIG. 7 and FIG. 8 to explain the maneuver of Seesaw 200(*b*)

in FIG. 9, wherein the definition of the first logic level, the second logic level, the third logic level, and the fourth logic level are same as the SPT_W 201.

Initially, the first logic level on said first action node (act) keeps disabling M1 and enabling M2 via M3, and enabling M3 by feedback connection, and said first poise node (Poise) locates on the third logic level.

In step one, said first action node gradually transforms to the second logic level to enable M1 and disable M2, and then disable M3 by feedback connection, and said first poise node gradually escapes from the third logic level according to the fourth logic level inputted into Poise. After the voltage variation on said first action node reaches the trigger level, the voltage value on said first poise node quickly escapes from the third logic level according to the fourth logic level inputted into Poise.

In step two, said first action node turns back to the first logic level to provide a pull-low current required for turning back to the initial step.

In step three, as long as the voltage value inputted into said first poise node is still the fourth logic level, Poise locates on the fourth logic level.

In step four, after the voltage value inputted into said first poise node changes to the third logic level, Poise turns back to the third logic level, and then, the pull-low current on said first action node cooperates with the voltage value on said first poise node to disable M1 and enable M2, and enable M3 by feedback connection.

When NMOS and PMOS are replaced with each other based on the circuit of Seesaw 200(*b*), the polarity of power also needs to be changed. In this way, the detection and the output of the inverse voltage can be implemented. This method is implemented according to the characteristic of CMOS process technology to replace the complementary transistors and the polarity of power.

Figure 10:
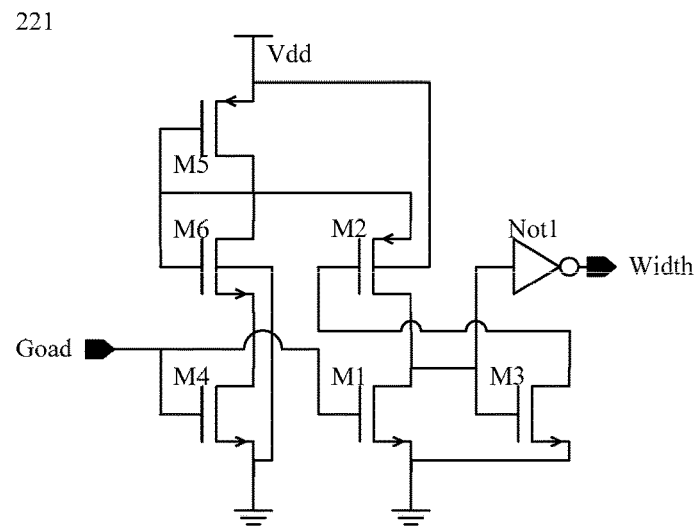
FIG. 10 is a diagram illustrating a circuit SPT2_W according to an embodiment of the present invention.

The seventh embodiment of the present invention: refer to FIG. 10, which is an exemplary circuit diagram, wherein the SPT2_W 201 is consisting of six transistors under transistor-level design whose function is similar to aforementioned SPT_W 201. Further, being implemented under transistor-level design can reduce the layout area. In FIG. 10, M1 to M6 are a MOSEFT respectively stated as first to sixth transistor.

The wiring net of SPT2_W 221 is acquired after improving the circuit of Seesaw 200(*b*), wherein the connection for M1-M3 is similar to M1-M3 in the Seesaw 200(*b*); the connection for M4-M6 is similar to a voltage regulator which is not only for setting the voltage level of the output voltage, but also for increasing pulse width. A Level Switcher (LS) is consisting of M1 to M3 whose output voltage is contrary to its input voltage, therefore, Not1 is being used to make the polarity of Width identical to that of Goad.

The circuit of said LS at least comprises a stimulated level node, a first action node, a first output node, a power terminal point, a ground terminal point, a first transistor, a second transistor, and a third transistor.

The wiring net for said first transistor is described as follows: the source terminal connects to said ground terminal point; the gate terminal couples to said first action node; the drain terminal connects to drain terminal of said second transistor and gate terminal of said third transistor, and couples to said first output node.

The wiring net for said second transistor is described as follows: the source terminal connects to said stimulated level node; the gate terminal connects to drain terminal of said third transistor; the drain terminal connects to drain terminal of said first transistor and gate terminal of said third transistor, and couples to said first output node; and the bulk connects to said power terminal point.

The wiring net for the third transistor is described as follows: the source terminal connects to said ground terminal point; the gate terminal connects to drain terminals of said first and said second transistors, and couples to said first output node; and the drain terminal connects to gate terminal of said first transistor.

Figure 11:
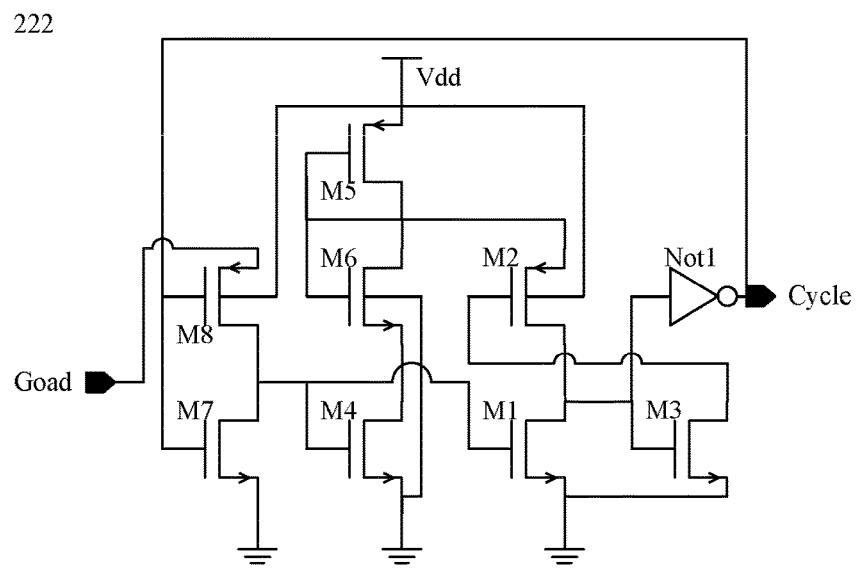
FIG. 11 is a diagram illustrating a circuit SPT2_C according to an embodiment of the present invention.

The eighth embodiment of the present invention: refer to FIG. 11, which is an exemplary circuit diagram, wherein the SPT2_C 222 is consisting of eight transistors under transistor-level design whose function is similar to that of the SPT_C 202. M1 to M8 are a MOSFET respectively stated as first to eighth transistor.

M7 and M8 are additionally added on the circuit of SPT2_W 221 to cyclically produce pulse signal. When NMOS and PMOS are replaced with each other based on the circuits of SPT2_W 221 and SPT2_C 222, the polarity of power also needs to be changed in the meantime. In this way, the detection and the output of inverse voltage can be implemented. This method is implemented based on the characteristic of CMOS process technology to replace the complementary transistor and the polarity of power.

Figure 12:
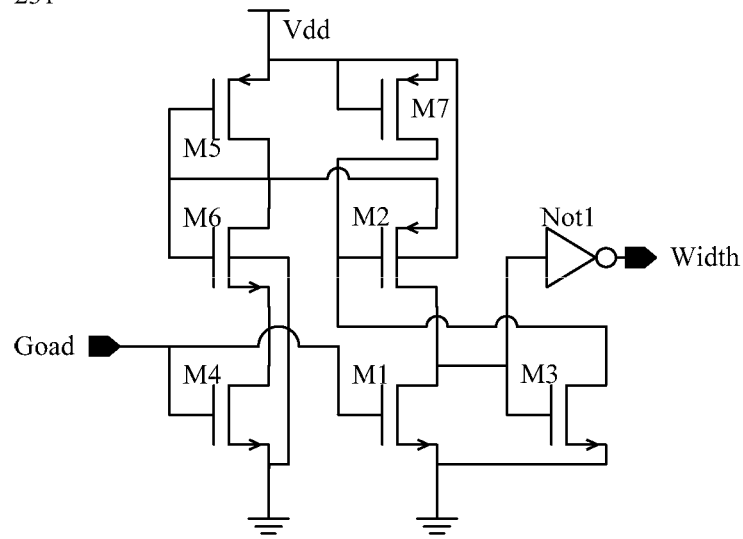
FIG. 12 is a diagram illustrating a circuit SPT3_W according to an embodiment of the present invention.

The ninth embodiment of the present invention: refer to FIG. 12, which is an exemplary circuit diagram, wherein the SPT3_W 231 is consisting of seven transistors under transistor-level design whose function is similar to those of aforementioned SPT2_W 221. M1 to M7 are a MOSFET respectively stated as first to seventh transistor.

M7 is additionally added on the circuit of SPT2_W 221 to enhance the stability of pulse signal. The wiring net of said seventh transistor is described as follows: the source terminal connects to said power terminal point; the gate terminal connects to said power terminal point; the drain terminal connects to gate terminal of said second transistor and drain terminal of said third transistor.

Figure 13:
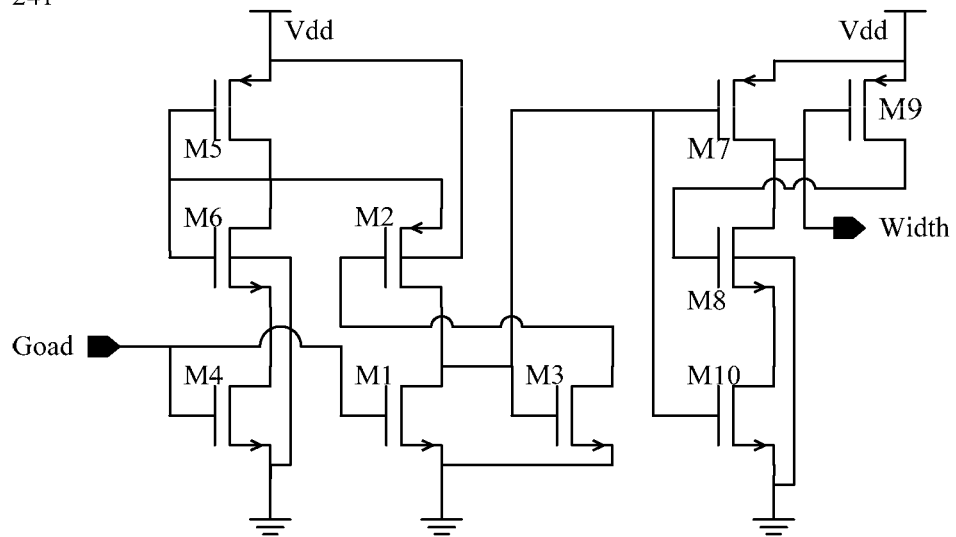
FIG. 13 is a diagram illustrating a circuit SPT4_W according to an embodiment of the present invention.

The tenth embodiment of the present invention: refer to FIG. 13, which is an exemplary circuit diagram, wherein the SPT4_W 241 is consisting of ten transistors under transistor-level design whose function is similar to those of aforementioned SPT2_W 221. M1 to M10 are a MOSFET respectively stated as first to tenth transistor.

M7 to M10 are additionally added on the circuit of SPT2_W 221 to enhance the stability of pulse signal, wherein a first LS is consisting of M1-M3, and the output voltage of this module is contrary to its input voltage; a second LS is consisting of M7-M9, and the output voltage of this module is contrary to its input voltage. The voltage level of the input connective point of M1-M3 is increased to the trigger level from a relatively low voltage level while the voltage level of the input connective point of M7-M9 is decreased to the trigger level from a relatively high voltage level. According to aforementioned working characteristic, said first LS and said second LS can be alternatively used, and can be connected in several stages to enhance the stability of the output signal. Therefore, in the last stage of the circuit, the purpose of M10 is arranged to acquire the rail-to-rail voltage level.

Basically, the circuit of aforementioned SPT4_SRAM 301 is implemented based on SPT4_W 241 by adjusting the transistors in SPT4_W 241 with aforementioned memory element, finally coupling the output of said first LS in SPT4_W 241 to pull in aforementioned SPT4_SRAM 301 to implement aforementioned SPT4_SRAM 301.

Cell Voltage Regulator:

The Cell Voltage Regulator (CVR) is designed according to the characteristic of aforementioned memory element for providing the working voltage of aforementioned SRAM cell 100. Through abovementioned paragraphs, it can be realized that the CAH 300 can detect a slight voltage variance via the SPT4_SRAM 301; in addition, the abovementioned paragraph already explains the acceptable working voltage for aforementioned SRAM cell 100. Because 5T/4T/3T1R SRAM cell has good stability on retention, the normal voltage of the cells can equal to or lower than the threshold voltage of the transistor within the cells. In this way, the leakage current can be greatly reduced, and in the preferred embodiments, the reading voltage equals to the normal voltage and the high speed reading can be achieved with the cooperation of the SPT4_SRAM 301. In the preferred embodiments of 3T1D/3T1C SRAM, the reading voltage equals to the normal voltage, the normal voltage is higher than the standby voltage, and the standby voltage changes with the working temperature because the leakage current changes with the temperature.

Figure 14:
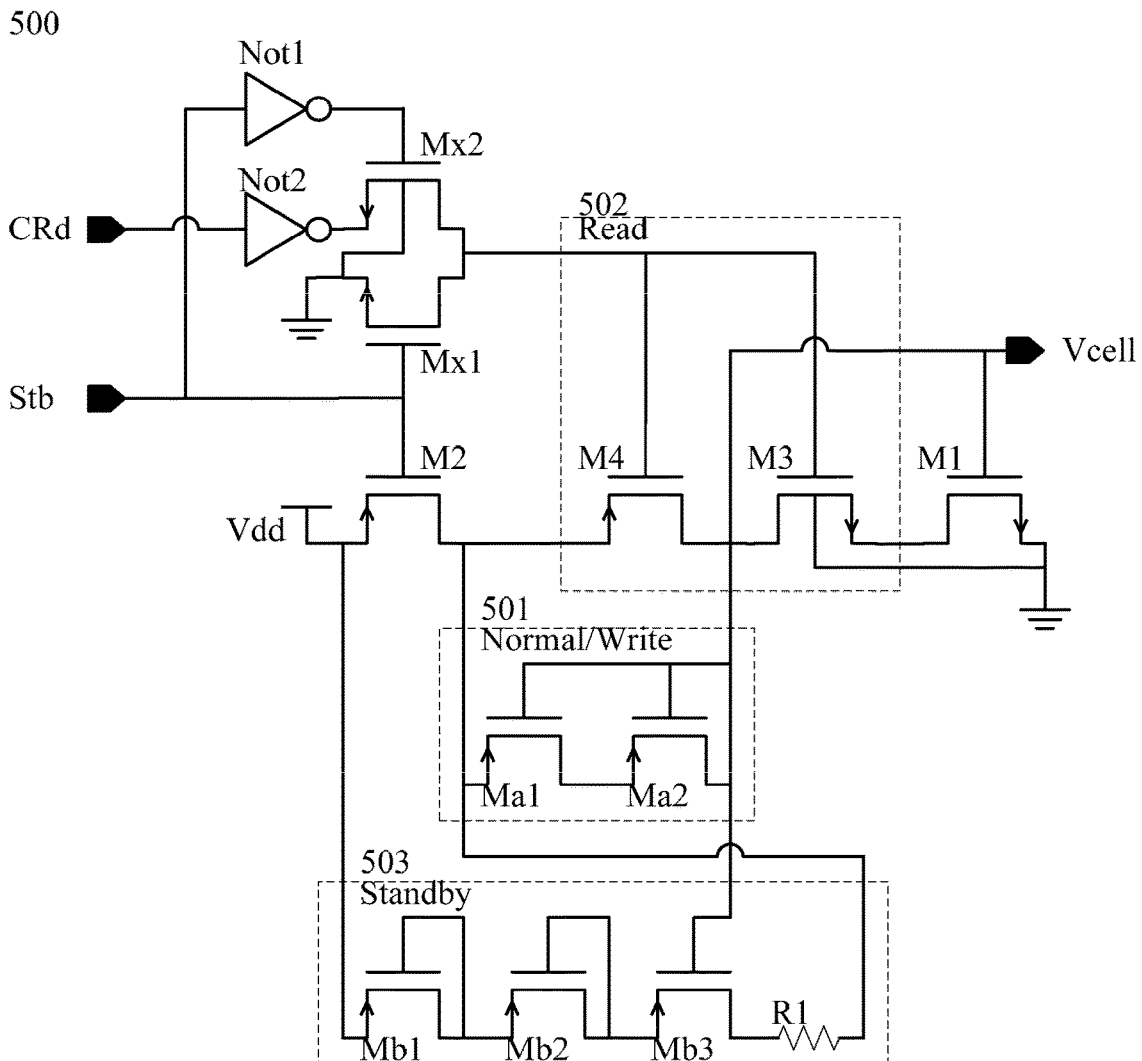
FIG. 14 is a diagram illustrating a Cell Voltage Regulator according to an embodiment of the present invention.

The eleventh embodiment of the present invention: refer to FIG. 14, which is an exemplary circuit diagram. The Cell Voltage Regulator 500 (CVR 500) is consisting of a plurality of transistors under transistor-level design, wherein the main elements of there are M1 to M3 which are a MOSFET respectively stated as first to third transistor.

An input node: Cell Read, hereinafter "CRd", is a control node for initiating the function of cell read and obtaining storage status of aforementioned memory element.

An input node: Standby, hereinafter "Stb", is a control node for starting the function of standby voltage and providing the standby voltage to aforementioned memory element. The other nodes are similar to those described above.

The CVR 500 is designed for aforementioned 5T/4T/3T1R SRAM cell, wherein M1 will adjust pull-low current according to the voltage of Vcell, M2 will provide pull-high current according to a control signal of Stb, M3 will provide pull-low current according to the control signal of CRd, M4 will provide pull-high current according to the control signal of CRd, Ma1-Ma2 will provide a first current path according to the control signals of Stb and CRd, and Mx1-Mx2 and Not1-Not2 design the corresponding combinational logics according to the control signals of Stb and CRd, and control the working voltage of aforementioned memory cell. M3-M4 cooperate with the maneuver of M1-M2 to provide the reading voltage, Ma1-Ma2 cooperate with the maneuver of M1-M4 to provide the writing voltage and the normal voltage, and Mb1-Mb3 and R1 cooperate with the maneuver of M1-M4 to provide the standby voltage.

The circuit of CVR 500 at least comprises a first control node, a second control node, a cell power terminal point, a power terminal point, a ground terminal point, a first current path, a second current path, a first transistor, a second transistor, a third transistor, and a fourth transistor.

The following operations should be read in conjunction with FIG. 14 to explain how the electronic elements provide the normal voltage and the writing voltage: said first transistor adjusts pull-low current according to said cell power terminal point; said second control node directly enables said second transistor to provide pull-high current; said first control node combines said second control node to enable said third transistor to provide pull-low current; said first control node combines said second control node to disable said fourth transistor; and the current of said cell power terminal point passes said second transistor and said first current path. Wherein a third current path can be extra provided for the writing voltage.

The following operations should be read in conjunction with FIG. 14 to explain how those electronic elements provide the reading voltage: said first transistor adjusts pull-low current according to said cell power terminal point; said second control node directly enables said second transistor to provide pull-high current; said first control node combines said second control node to disable said third transistor; said first control node combines said second control node to enable said fourth transistor to provide pull-high current; and the current of said cell power terminal point passes said second transistor and said fourth transistor.

The following operations should be read in conjunction with FIG. 14 to explain how those electronic elements provide the standby voltage: said second control node directly disables said second transistor, indirectly disables said third transistor, and indirectly enables said fourth transistor to provide pull-high current; the current of said cell power terminal point passes said second current path and said fourth transistor.

Figure 15:
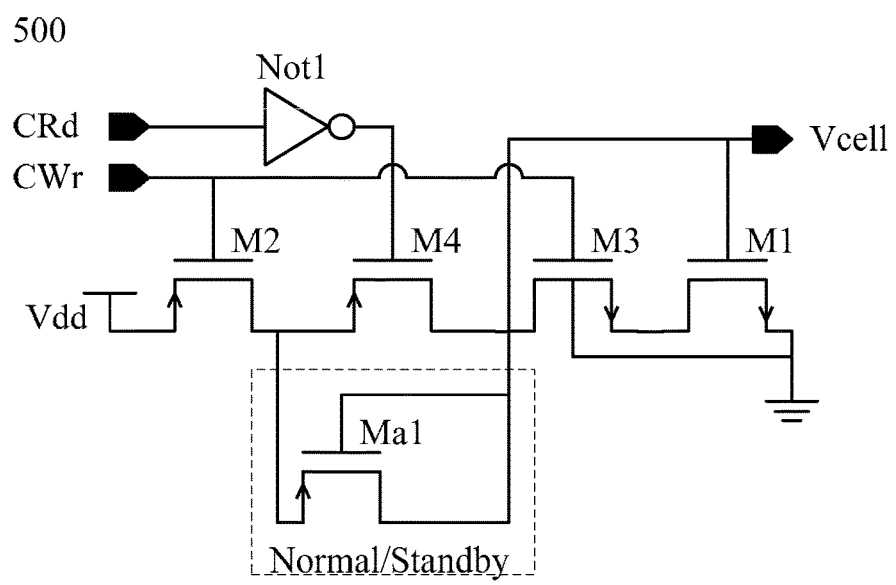
FIG. 15 is a diagram illustrating a Cell Voltage Regulator according to another embodiment of the present invention.

The twelfth embodiment of the present invention: refer to FIG. 15, which is an exemplary circuit diagram. CVR 500 is consisting of a plurality of transistors under transistor-level design, wherein the main elements of there are M1 to M3 which are a MOSFET respectively stated as first to third transistor. The other nodes are similar to those described above.

The CVR 500 is designed for aforementioned 5T/4T/3T1C SRAM cell, wherein M1 will adjust pull-low current according to the voltage of Vcell, M2 will provides pull-high current according to a control signal of CWr, M3 will provide pull-low current according to the control signal of CWr, M4 will provide pull-high current according to the control signal of CRd, Ma1 will provide a first current path according to the control signals of CWr and CRd. CWr directly controls M2-M3 to provide the writing voltage, CRd directly controls M4 to provide the reading voltage, and Ma1 cooperates with the maneuver of M1-M4 to provide the normal voltage and the standby voltage.

The circuit of CVR 500 at least comprises a first control node, a cell power terminal point, a power terminal point, a ground terminal point, a first transistor, a second transistor, a third transistor, and selectively comprises a second control node, a first current path, and a fourth transistor.

The following operations should be read in conjunction with FIG. 15 to explain how those electronic elements provide the normal voltage and the standby voltage: said second control node directly disables said fourth transistor; said first control node directly enables said second transistor to provide pull-high current and directly disable said third transistor; and the current of said cell power terminal point passes said second transistor and said first current path. Wherein a second current path can be extra provided for the standby voltage.

The following operations should be read in conjunction with FIG. 15 to explain how those electronic elements provide the writing voltage: said second control node directly disables said fourth transistor; said first transistor adjusts pull-low current according to said cell power terminal point; said first control node directly disables said second transistor and directly enables said third transistor to provide pull-low current. Because said second transistor has leakage current, the current of said cell power terminal point still passes said second transistor and said first current path.

The following operations should be read in conjunction with FIG. 15 to explain how those electronic elements provide the reading voltage: said first control node directly enables said second transistor to provide pull-high current and directly disables said third transistor; said second control node directly enables said fourth transistor to provide pull-high current; and the current of said cell power terminal point passes said second transistor and said fourth transistor. The Access System of SRAM:

The access system of SRAM taking any kind of SRAM cell as the core element to combine with peripheral access circuits and control circuits, then cooperating with data transmission interface and control interface to complete an independent and completed memory function. The product of the access system is a chip or a module such like a memory chip, a cache memory, a main memory of computer system and a memory of digital signal processor.

Figure 16:
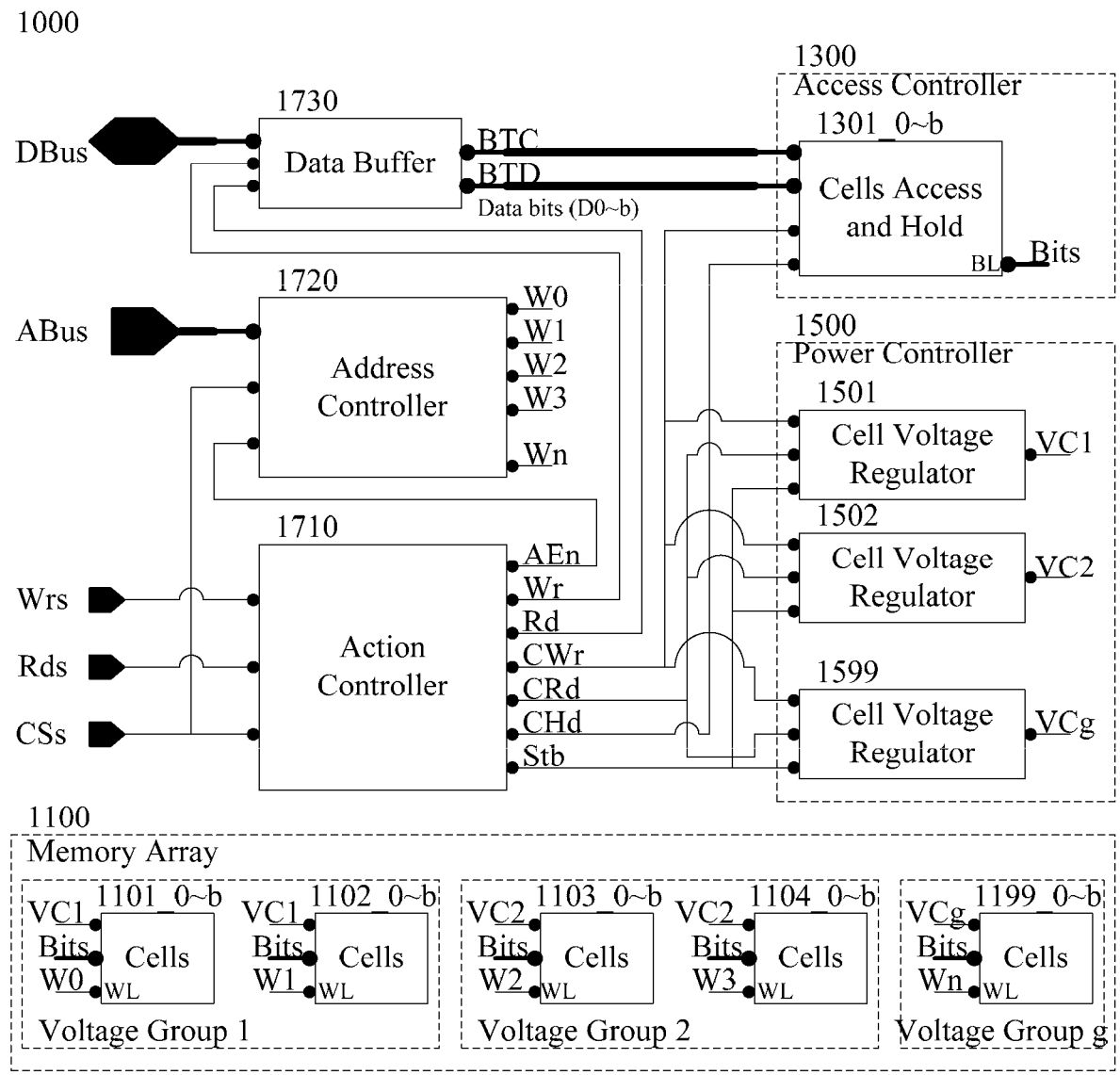
FIG. 16 is a function block diagram of SRAM chip according to an embodiment of the present invention.

The thirteenth embodiment of the present invention: refer to FIG. 16, which is an exemplary circuit diagram. In FIG. 16, the function block diagram of SRAM chip 1000 illustrates a general SRAM chip and basic transmission signals comprising data bus, address bus, write signal, read signal and chip select signal. In addition, those circuits mentioned above will also be included in the function block diagram of SRAM chip 1000, the detailed description is discussed in the following paragraphs.

The data bus is marked as "DBus" in the following which is a bus has multi-bit data width. For example, the number of data bits is from 0 to b, wherein b is data width minus one which is a basic knowledge for those skilled in the art.

The address bus is marked as "ABus" in the following which is a bus has multi-bit address width. After being decoded by a decoder, the address number is from 0 to n. A Row-and-Column Decoder can also be applied for the operation which is a basic knowledge for those skilled in the art.

The write signal is marked as "Wrs" in the following, and arranged to control said SRAM chip to write the value on data bus into the memory space indicated by current address bus which is a basic knowledge for those skilled in the art.

The read signal is marked as "Rds", and arranged to control said SRAM chip to read the value stored in the memory space indicated by current address bus, and send it to data bus which is a basic knowledge for those skilled in the art.

The chip select signal is marked as "CSs" in the following, and arranged to control said SRAM chip to perform the normal accessing operation which is a basic knowledge for those skilled in the art.

The function block diagram of SRAM chip 1000 comprises function blocks like a Memory Array 1100, an Access Controller 1300, a Power Controller 1500, an Action Controller 1710, an Address Controller 1720 and a Data Buffer 1730.

The Array Memory 1100 comprises a plurality of Cells 1101_0-b, 1102_0-b, 1103_0-b, 1104_0-b, and 1199_0-b, wherein data width of the cells is based on data width of DBus. For example, number of the data bits is from 0 to b then number of the cells is also from 0 to b. The plurality of the cells constitutes a plurality of voltage groups according to the configuration method of the cell supplying voltage such like Voltage Group 1, Voltage Group 2 and Voltage Group g.

The Access Controller 1300 comprises Cells Access and Hold 1301_0-b, wherein a plurality of circuits of CAH 300 included therein. The number is based on data width of DBus.

The Power Controller 1500 comprises a plurality of CVR 1501, 1502, 1599 which can change the voltage of a small area in Memory Array 1100 to prevent the access time from being affected by the global voltage variation, and can also reduce the power consumption of access. Therefore, a plurality of voltage groups such like Voltage Group 1, Voltage Group 2 and Voltage Group g, can be configured according to the configuring method of the cell supplying voltage. Those skilled in the art should readily understand how to set the number of the voltage groups. In addition, Memory Array 1100 can be grouped into a plurality of sections to fit the design specification, and with the plurality of sections design, aforementioned circuit of CAH can be separated from the circuit of cell hold accordingly and be installed in the plurality of sections, wherein the data transmission nodes in each section couple to a transmission gate to separate each circuit of cell hold which can also suppress the access interference between sections. Furthermore, a Column-and-Row Decoder in a DRAM chip can cooperate with the access signal to control transmission gates and circuits of cell hold. Aforementioned examples illustrate that the circuits configured between Access Controller 1300 and Power Controller 1500 can be adjusted according to the actual design consideration. The Power Controller 1500 can be implemented outside said SRAM chip 1000. However, it is hard to provide the plurality of voltage groups to Memory Array 1100; moreover, a switch power supplier can also be applied to Power Controller 1500, however, said power supplier increases access time, and might also increase the power consumption.

Figure 17:
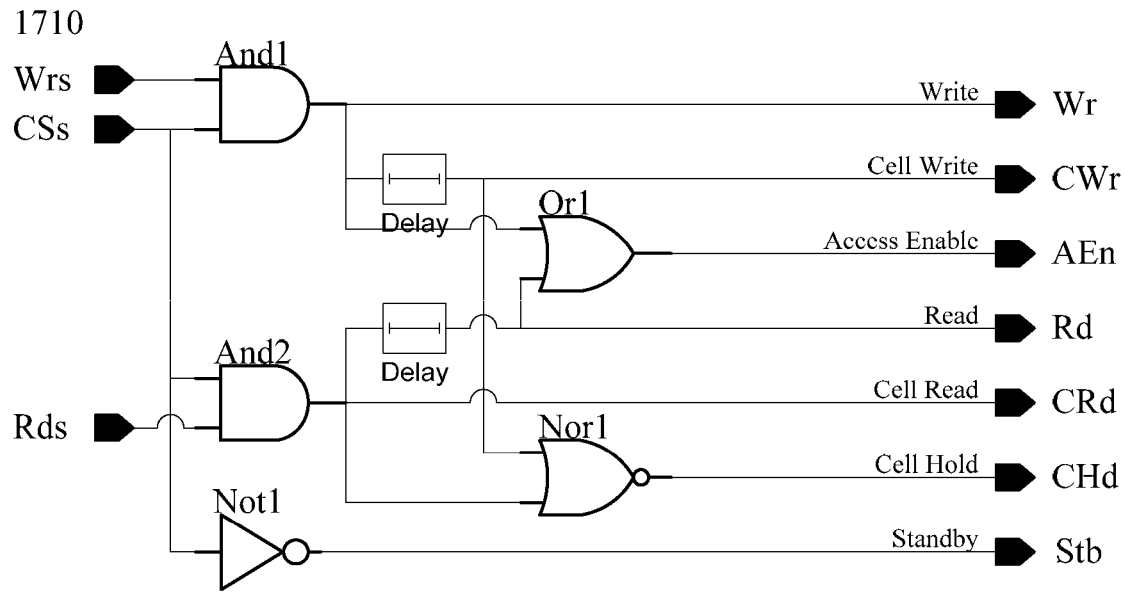
FIG. 17 is a circuit diagram illustrating an Action Controller in the prior art.

Refer to FIG. 17, which is an exemplary circuit diagram, wherein Action Controller 1710 comprises combinational logic circuits for receiving transmission signals from the transmission interface, and generating the corresponding control signals to complete various functions needed by the SRAM chip. This is a common technique to design circuits with the cooperation of related products for those skilled in the art. The following roughly explains the related control signals and the corresponding timing sequence: Wrs and Rds from the transmission interface are controlled by CSs, and Wr and Rd applicable for the internal circuits in said chip are generated accordingly.

Access Enable, hereinafter "AEn", is arranged to receive Wr and Rd to control the related circuits.

The maneuver for controlling CWr is later than the maneuver for controlling Wr, that is, the signal CWr is outputted after the related circuits complete the preparation.

The maneuver of controlling CRd is earlier than the maneuver of Rd, that is, the signal Rd is outputted after the status data of the memory cell is read.

The signal of CHd rely on CWr and CRd, and avoids conflict with CWr and CRd to prevent destructive readout.

The signal of Stb rely on the signal of CSs directly, but not a limitation of the present invention. It can be controlled by providing an input signal via the transmission interface.

Figure 18:
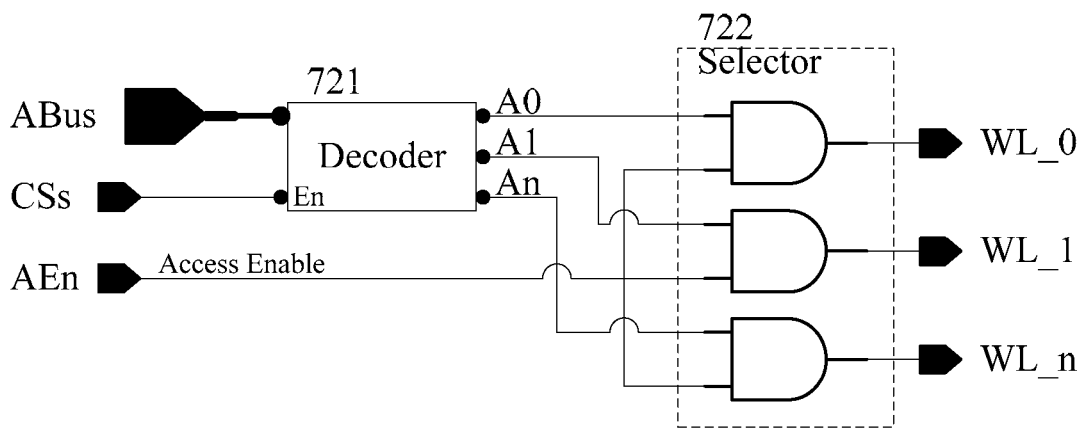
FIG. 18 is a circuit diagram illustrating an Address Controller in the prior art.

Refer to FIG. 18, which is an exemplary circuit diagram, wherein Address Controller 1720 comprises Decoder 721 and Selector 722. CSs enables Decoder 721 to decode ABus to acquire the address signal A0-An while AEn enables Selector 722 to produce Word Lines WL_0-WL-n.

Figure 19:
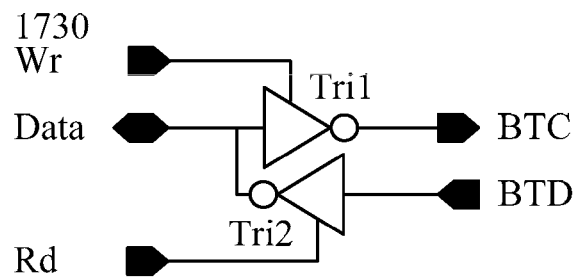
FIG. 19 is a circuit diagram illustrating a Data Buffer in the prior art.

Refer to FIG. 19, which is an exemplary circuit diagram, wherein Data Buffer 1730 comprises two tri-state gates controlled by Wr and Rd, respectively. After receiving the control signal of Wr, Data from the DBus is sent to BTC. After receiving the control signal of Rd, Data of the DBus receives values of BTD which is a well-known technology for those skilled in the art.

The Access System of DRAM:

The access system of DRAM taking any kind of DRAM cell as the core element to combine with peripheral access circuits and control circuits, then cooperating with data transmission interface and control interface to complete an independent and complete memory function.

Figure 20:
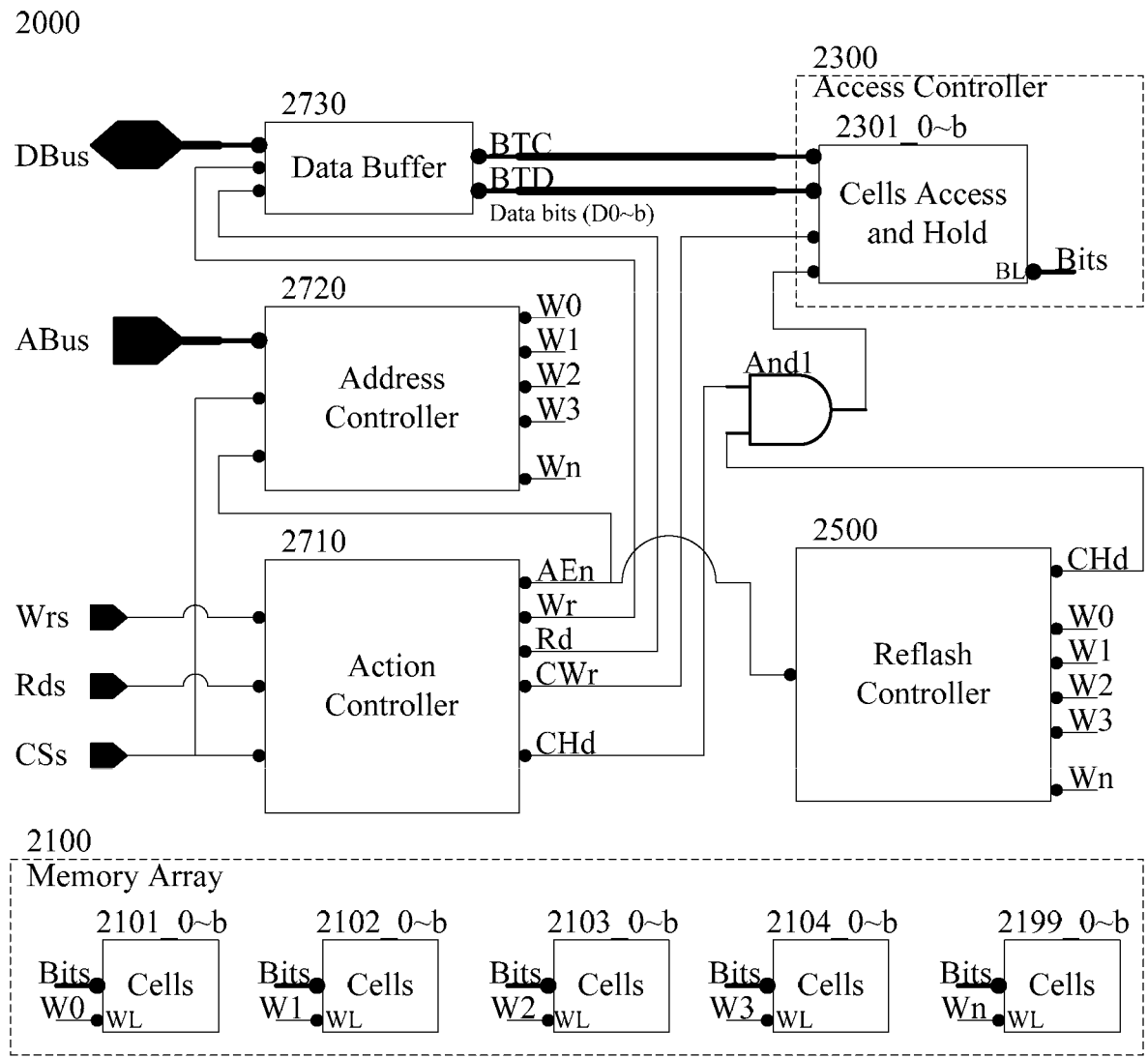
FIG. 20 is a function block diagram of DRAM chip according to an embodiment of the present invention.

The fourteenth embodiment of the present invention: refer to FIG. 20, which is an exemplary circuit diagram, wherein the function block diagram of DRAM chip 2000 illustrates a general DRAM chip and basic transmission signals comprising data bus, address bus, write signal, read signal and chip select signal. In addition, those circuits mentioned above will also be included in the function block diagram of DRAM chip 2000, the detailed description is discussed in the following paragraphs.

The function block diagram of DRAM chip 2000 comprises function blocks such like a Memory Array 2100, an Access Controller 2300, a Refresh Controller 2500, an Action Controller 2710, an Address Controller 2720 and a Data Buffer 2730.

The Memory Array 2100 comprises a plurality of Cells 2101_0-b, 2102_0-b, 2103_0-b, 2199_0-b, wherein data width of the cells is based on the data width of DBus. The DRAM cell can be 1T1C, 1T1D, 1T-SOI or others. Those skilled in the art should understand that Memory Array 2100 can be grouped into a plurality of sections to fit the design specification, and with the plurality of sections design, aforementioned circuit of CAH can be separated from the circuit of cell hold accordingly and be installed in the plurality of sections, wherein the data transmission nodes in each section couples to a transmission gate to separate each circuit of cell hold which can also suppress the access interference between sections. Furthermore, a Column-and-Row Decoder in a DRAM chip can cooperate with the access signal to control transmission gates and circuits of cell hold. Aforementioned examples mean the circuit configuration of Access Controller 2300 can be adjusted according to the actual design consideration.

The Access Controller 2300 comprises Cells Access and Hold 2301_0-b, and a plurality of CAH 300 are included therein, wherein the number is based on the data width of Dbus.

The Refresh Controller 2500 is a circuit generated according to the characteristic of DRAM cell which is a well-known technique for those skilled the art. In the prior art, the refresh operation for DRAM cell must be read first then write, i.e. Read-then-Write architecture. However, with the help of Access Controller 2300, Refresh Controller 2500 disclosed by the present invention can complete the write action during read period. In this case, the operation can be done effectively due to Access Controller 2300 can complete the rewrite operation during the read period.

The Action Controller 2710, Address Controller 2720 and Data Buffer 2730 are similar to the Action Controller 1710, Address Controller 1720 and Data Buffer 1730.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An access device compatible with a Dynamic Random-Access Memory cell, a circuit of said memory cell comprising a data transmission node and a transmission control node, said data transmission node being arranged to write and read data, said transmission control node being arranged to control data input and output; wherein said access device comprises a trigger and a transistor, said trigger comprises a signal input connective point and an output connective point, and said transistor comprises a data rewrite connective point and a control input connective point; said signal input connective point is connected or coupled to said data rewrite connective point, and said data transmission node is connected or coupled to said signal input connective point; said output connective point connects to said control input connective point; during the cell read operation, when said trigger detects that the variation of said data transmission node exceeds the trigger level, said transistor is turned on, otherwise said transistor remains turned off; and the rewrite operation of said memory cell is arranged to turn on said transistor.

2. The access device of claim 1, the circuit of said memory cell further comprising a storage cell; wherein said storage cell consisting of a transistor and a capacitor, or consisting of a transistor and an equivalent capacitance.

3. The access device of claim 2, wherein said equivalent capacitance is a depletion capacitance formed by one or more PN junction diodes.

4. A storage device, at least comprising: a Dynamic Random-Access Memory array and an access controller, wherein said access controller comprises the access device of claim 1.

* * * * *